United States Patent
Chakraborty et al.

(10) Patent No.: US 11,121,675 B2
(45) Date of Patent: Sep. 14, 2021

(54) REMOTELY POWERED LOW POWER OSCILLATOR

(71) Applicant: International Business Machines Corporation, Armonk, NY (US)

(72) Inventors: Sudipto Chakraborty, Plano, TX (US); Rajiv Joshi, Yorktown Heights, NY (US); Steven J. Holmes, Ossining, NY (US); Bruce B. Doris, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/726,465

(22) Filed: Dec. 24, 2019

(65) Prior Publication Data

US 2021/0194427 A1 Jun. 24, 2021

(51) Int. Cl.
 *H03B 5/12* (2006.01)
 *H03L 1/00* (2006.01)
 *H03L 5/00* (2006.01)

(52) U.S. Cl.
 CPC ............ *H03B 5/1215* (2013.01); *H03L 1/00* (2013.01); *H03L 5/00* (2013.01)

(58) Field of Classification Search
 CPC  H03B 5/1215; H03L 1/00; H03L 1/02; H03L 1/021; H03L 1/022; H03L 1/026; H03L 1/028; H03L 5/00; H03L 5/02
 USPC .......................... 331/176, 182, 183, 185, 186
 See application file for complete search history.

(56) References Cited

U.S. PATENT DOCUMENTS

| | | | |
|---|---|---|---|
| 3,732,728 A | 5/1973 | Fitzpatrick | |
| 3,819,960 A | 6/1974 | Kohn et al. | |
| 3,854,034 A | 12/1974 | Leitner et al. | |
| 4,425,628 A | 1/1984 | Bedard et al. | |
| 4,593,559 A | 6/1986 | Brown et al. | |
| 5,289,075 A | 2/1994 | Besson et al. | |
| 5,691,661 A | 11/1997 | Fukuda et al. | |
| 5,719,534 A * | 2/1998 | Imura | H03K 3/012 331/116 FE |
| 7,586,934 B2 | 9/2009 | Hall et al. | |
| 7,724,078 B2 * | 5/2010 | Kurd | H03L 7/107 327/544 |
| 7,937,599 B1 | 5/2011 | Thomas et al. | |
| 7,973,612 B2 * | 7/2011 | Raghunathan | H03L 7/22 331/185 |
| 8,362,848 B2 * | 1/2013 | Raghunathan | H03L 7/0805 327/156 |
| 10,581,440 B2 * | 3/2020 | Zerbe | H03L 1/00 |

(Continued)

*Primary Examiner* — Levi Gannon
(74) *Attorney, Agent, or Firm* — Scully, Scott, Murphy & Presser, P.C.; Daniel P. Morris

(57) ABSTRACT

A remotely powered low power oscillator. According to an embodiment of the present invention, a method comprises an oscillator core, in a first environment, generating an oscillating signal; a power management system, in a second environment, supplying power to the oscillator core to operate the oscillator core; a sensing system, in the first environment, sensing one or more parameters of the oscillator core, and generating one or more signals representing said one or more parameters; transmitting the one or more signals from the sensing system to the second environment; and using the one or more signals in the second environment to control the power supplied to the oscillator core from the power management system.

18 Claims, 10 Drawing Sheets

(56) References Cited

U.S. PATENT DOCUMENTS

| | | | |
|---|---|---|---|
| 2005/0206463 A1* | 9/2005 | Godambe | H03L 3/00 331/74 |
| 2009/0051443 A1* | 2/2009 | Illegems | H03K 3/011 331/57 |
| 2010/0134197 A1* | 6/2010 | Aoki | H03L 3/00 331/186 |
| 2016/0322976 A1* | 11/2016 | Chern | G05F 3/245 |

* cited by examiner

502 — - SET A SPECIFIC VALUE OF CURRENT BY USING $I_{REF}=V_{REF}/R_{REF}$

504 — - OBTAIN OSCILLATOR AMPLITUDE

506 — - SET $R_T$ TO INITIAL SETTING TO OBTAIN DESIRED VOLTAGE SWING

510 — - DETECT THE VALUE OF $V_{PD}$

512 — - ADJUST $R_T$ TILL $V_{PD}$ EQUALS TO THE DESIRED VALUE

FIG. 5

| Iavg core (mA) | Amplitude-ppd(mV) | Frequency (MHz) | Phase noise @1MHz | Phase noise @10MHz | Peakdet voltage (mV) |
|---|---|---|---|---|---|
| 2.39 | 2209.40 | 9681.52 | -109.93 | -130.81 | 408.94 |
| 1.57 | 1584.27 | 9691.61 | -106.53 | -128.24 | 411.27 |
| 1.11 | 1206.64 | 9736.31 | -104.41 | -126.02 | 417.31 |
| 0.88 | 998.72 | 9769.28 | -103.41 | -124.51 | 431.58 |
| 0.75 | 865.42 | 9791.35 | -102.64 | -123.32 | 456.82 |

REMOTELY POWERED LOW POWER OSCILLATOR

BACKGROUND

This invention, generally, relates to low power oscillators, and more specifically, to remotely powered low power oscillators.

SUMMARY

According to an embodiment of the present invention, a method comprises an oscillator core, in a first environment, generating an oscillating signal; a power management system, in a second environment, supplying power to the oscillator core to operate the oscillator core; a sensing system, in the first environment, sensing one or more parameters of the oscillator core, and generating one or more signals representing said one or more parameters; transmitting the one or more signals from the sensing system to the second environment; and using the one or more signals in the second environment to control the power supplied to the oscillator core from the power management system.

According to an embodiment of the invention, a system comprises an oscillator core, in a first environment, for generating an oscillating signal; a power management system, in a second environment, for supplying power to the oscillator core to operate the oscillator core; a sensing system, in the first environment, for sensing one or more parameters of the oscillator core, for generating one or more signals representing said one or more parameters, and for transmitting the one or more signals from the sensing system to the second environment; and a control for using the one or more signals in the second environment to control the power supplied to the oscillator core from the power management system.

Embodiments of the invention use power management at room temperature (20° C.-25° C.) for a remotely powered low power oscillator, and provide reference current to the oscillator located at a remote temperature chamber.

In embodiments of the invention, the oscillator is physically located in the same environment as the temperature sensor (and other items such as a computing element, etc.).

In embodiments of the invention, the quality factor (Q) of the inductive elements of the oscillator provides an indication of the temperature of the oscillator. The change in the swing of the oscillation of the oscillator is proportional to the Q factor, and the current consumption of the oscillator is inversely related to the Q factor.

High power supply rejection regulators can be designed to operate at room temperature (both PMOS and NMOS type low-dropout (LDO) regulators can be used).

In embodiments of the invention, the frequency of oscillation, swing, and current consumption of the oscillator can be controlled at room temperature, leading to accurate temperature measurements, and low power operation of the remote oscillator.

In embodiments of the invention, specified measurements are performed by measuring DC current, enhancing the accuracy of the measurements.

Embodiments of the invention provide a low power oscillator remotely powered by a power management system.

In embodiments of the invention, low jitter is ensured by high power supply rejection ratio (PSRR) blocks designed to operate at room temperature.

In embodiments of the invention, monitoring is performed in a current mode. Current is supplied to the oscillator from a remote chamber, and current from the oscillator, proportional to the frequency or amplitude of the oscillator output signal, is sensed at the remote chamber.

Embodiments of the invention can be used as a temperature sensor to sense the ambient temperature of a remote environment containing a low power oscillator.

Embodiments of the invention may use MRAM as an inductor for the circuit system.

In embodiments of the invention, the sensing system sensing one or more parameters of the oscillator core includes using a magnetic RAM as an inductor for coupling the sensing system to the oscillator core.

BRIEF DESCRIPTION OF THE DRAWINGS

FIG. 5 illustrates a procedure in accordance with an embodiment of the invention.

DETAILED DESCRIPTION

It is difficult to build low power oscillators that operate accurately when the power management system for the oscillators are located in different environments than the core oscillator systems, which is the typical case for low temperature computing systems, and also occurs in some high temperature computing systems such as those used in oil drilling. It is required to keep the instrumentation interface simple and use the oscillator as a dual purpose functional block that can provide oscillation signal, as well as measuring the ambient temperature of the remote environment.

A traditional method of operating a low power oscillator uses a power management system (which provides voltage and a reference current for the core oscillator) that is located at the same environment as the core oscillator. The temperature sensing system of the power management system is located at the same environment as the core oscillator. This requires that a greater part of the overall oscillator system be built at the same environment as the core oscillator, leading to an implementation difficulty in some environments. It is difficult to develop a temperature sensor for a low power oscillator that operates effectively at extreme temperatures (both extreme low and extreme high temperatures). Precise voltage references such as bandgap reference, are very difficult to implement over wide temperature ranges which can operate with high accuracy and reliability.

Figure 1:
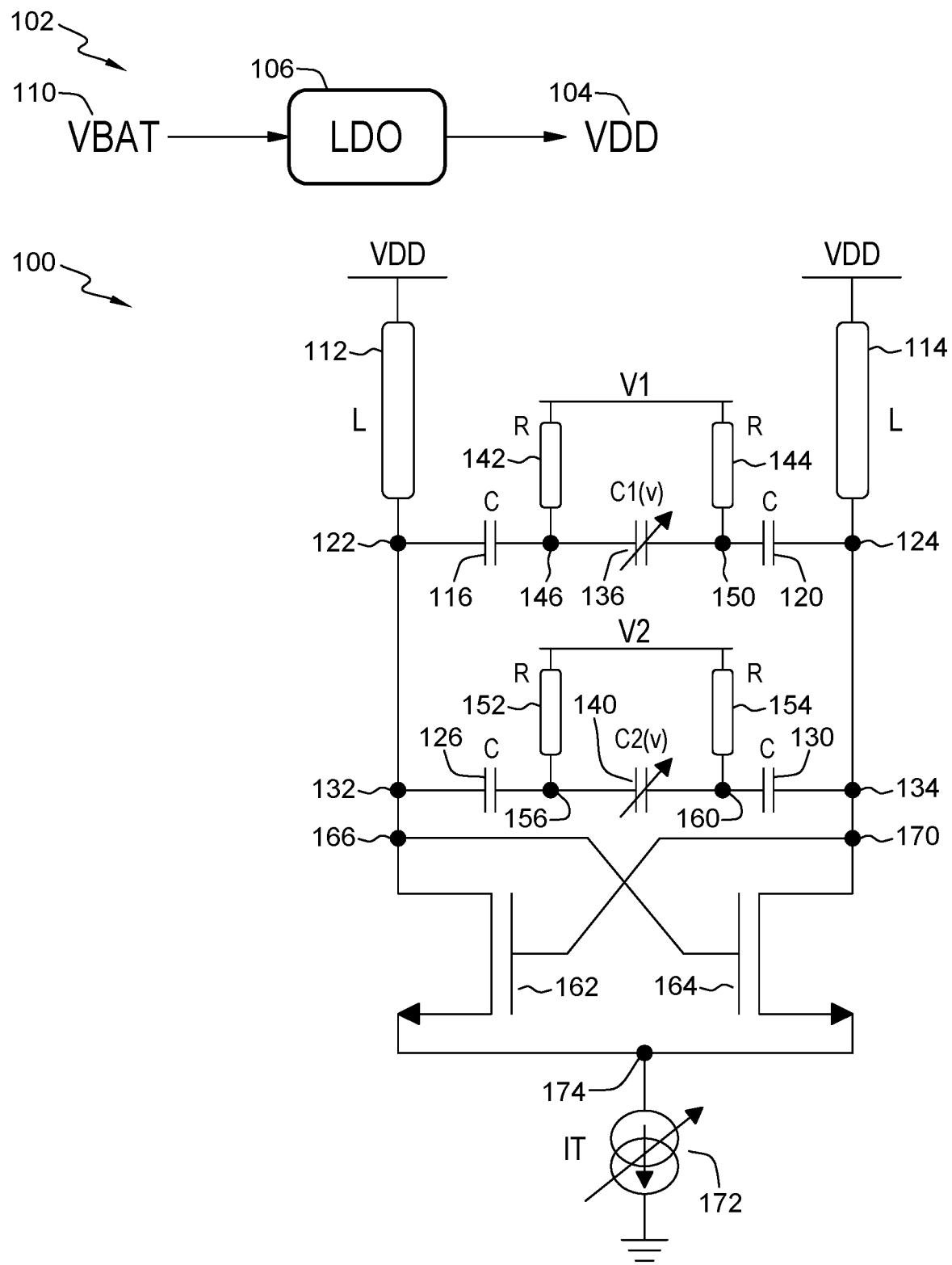
FIG. 1 illustrates a prior art low power oscillator.

FIG. 1 illustrates a prior art low power oscillator 100. As represented at 102, the power voltage, VDD, 104 is supplied from a battery 106, through a high PSRR LDO 110.

Oscillator 100 comprises a pair of single ended inductors 112, 114, which may be implemented physically as a pair of single ended inductors or a single differential inductor. A first pair of capacitors 116, 120 are located in series between nodes 122, 124, and a second pair of capacitors 126, 130 are located in series between nodes 132, 134. A variable capacitor 136 is located in series between capacitors 116, 120, and a variable capacitor 140 is located in series between capacitors 126, 130. A pair of parallel resistors 142, 144 are connected to nodes 146, 150, one on either side of variable capacitor 136; and a pair of parallel resistors 152, 154 are connected to nodes 156, 160, one on either side of variable capacitor 140.

A pair of cross-coupled semiconductor devices 162, 164 are connected in oscillator 100. The drain of device 162 is connected to node 166 and coupled to node 132; and the drain of device 164 is connected to node 170 and coupled to node 134. The gate of device 162 is connected to node 170, and the gate of device 164 is connected to node 166. The sources of devices 162 and 164 are connected to each other and to current source 172 via node 174.

In the implementation of oscillator 100, $V_{DD}$ is applied to each inductor 112, 114. The inductors 112, 114 and capacitors 116, 120 of oscillator 100 generate an oscillating signal across nodes 122 and 124. $V_1$ and $V_2$ are DC voltages obtained from the charge-pump of the PLL, to change the oscillator frequency by changing the voltage variable capacitors 136 and 140.

With the oscillator of FIG. 1, $V_{DD}$ is applied through a high power supply rejection ratio (PSRR) low-dropout (LDO) regulator 106. The low-dropout regulator is located at a different environment as the oscillator 100. The low-dropout regulator can consume higher power to reduce noise and to improve the power supply ripple rejection. The low-dropout regulator may be significant overhead to the system. Achieving good power supply ripple rejection over a wide temperature range is very difficult. To prevent large voltage drop, this LDO provides DC current to the remote oscillator residing in a different environment.

With the oscillator circuit of FIG. 1, current based biasing upconverts noise, and power supply noise gets upconverted to the carrier frequency. In this circuit, variable capacitors 136 and 140 are coupled directly from the charge pump, and the DC voltages $V_1$ and $V_2$ are DC voltages used as offset to linearize the capacitance vs. voltage curve of the composite varactor characteristics.

Figure 2:
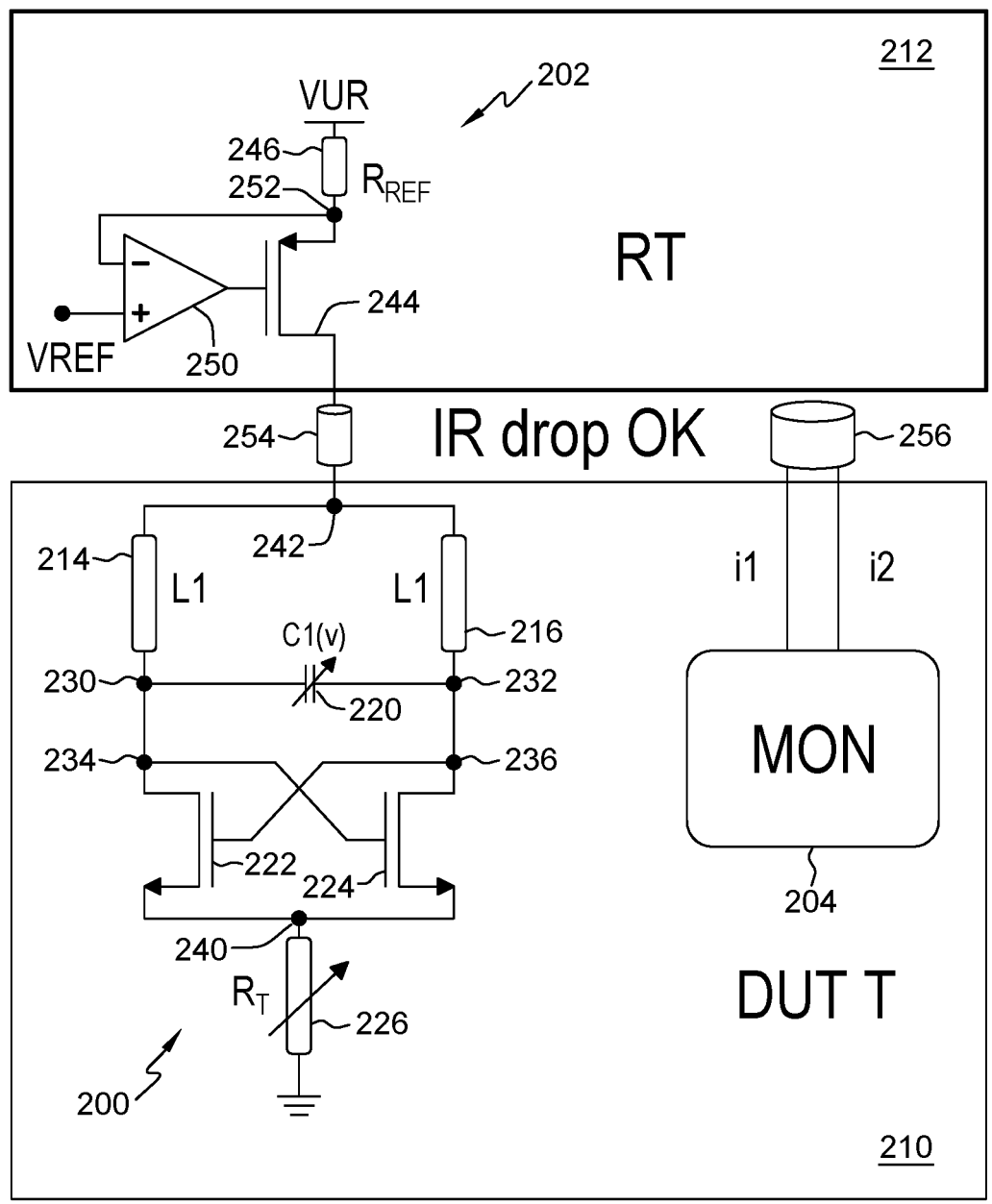
FIG. 2 illustrates a low power oscillator according to an embodiment of the invention.

FIG. 2 illustrates a low power oscillator 200 in accordance with an embodiment of the invention. More specifically, FIG. 2 shows a low power oscillator 200, a power supply 202 for the oscillator, and a temperature monitor 204. In this embodiment, oscillator 202 is located in a first environment 210, temperature monitor 204 is located in the same environment 210 as the oscillator 202, and power supply 202 is located in a remote environment (RT) 212, typically at room temperature.

With the embodiment shown in FIG. 2, oscillator 200 comprises a pair of single ended inductors 214, 216, a variable capacitor 220, a pair of cross-coupled semiconductor devices 222, 224, and a variable resistor 226. In another embodiment, the two L1 inductors may also be realized using a single differential inductor where the node 242 can denote the center tap of the inductor. Variable capacitor 220 is connected between nodes 230, 232, in parallel across inductors 214, 216. The drain of semiconductor device 222 is connected to node 234, and the drain of semiconductor device 224 is connected to node 236. The gate of device 222 is connected to node 236, and the gate of device 224 is connected to node 234. The sources of devices 222, 224 are connected to each other and to ground via node 240, and variable resistor 226 is located between node 240 and ground.

Power is supplied to oscillator 200 from power supply 202 via node 242. In the embodiment illustrated in FIG. 2, power is supplied from an unregulated voltage source $V_{UR}$ via a pass transistor device 244, and a reference resistor 246 may be located between voltage source $V_{UR}$ and pass transistor 244 to realize a specific current. The magnitude of this current is given by $I_{REF}=(V_{UR}-V_{REF})/R_{REF}$. The output of an error amplifier 250 is applied to the gate of device 244 to control the current output from the semiconductor device. The voltage in power supply 202 at node 252 is applied to one input of the error amplifier 250, and a reference voltage is applied to the other input of the error amplifier.

As represented in FIG. 2, monitor 204 monitors the amplitude of the oscillator 200 which is dependent on temperature, and generates one or more currents $I_2$, $I_2$ representing that temperature, and the generated one or more currents are transmitted to remote environment 212. Current mode signaling between the two environments reduces the DC voltage drop and electromagnetic cross-talk caused due to the instrumentation wiring between the two environments. The generated one or more currents are used, in remote environment 212, to determine the voltage that is applied from power supply 202 to oscillator 200. In the embodiment shown in FIG. 2, resistor 254 represents the instrumentation wiring resistance located between two environments, and provides DC voltage drop. Resistor 256 also represents the instrumentation wiring resistance located between monitor 204 and the remote environment 212 to drop, and provides DC voltage drop.

Figure 2A:
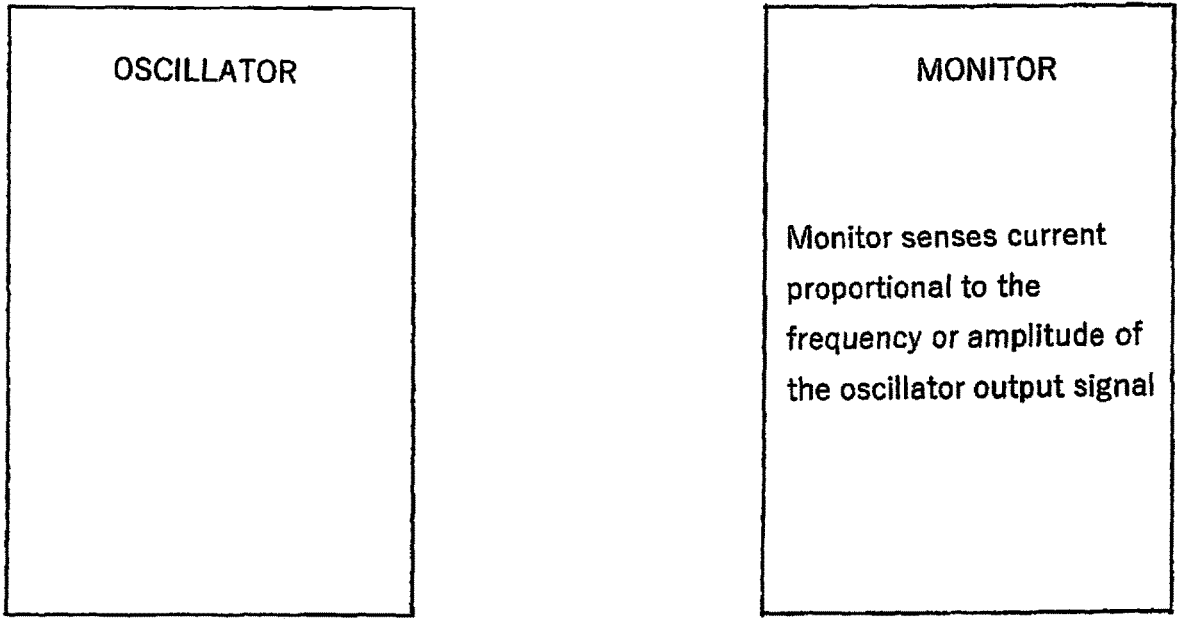
FIG. 2A illustrates parameters of the low power oscillator that may be monitored in embodiments of the invention.
Figure 2B:
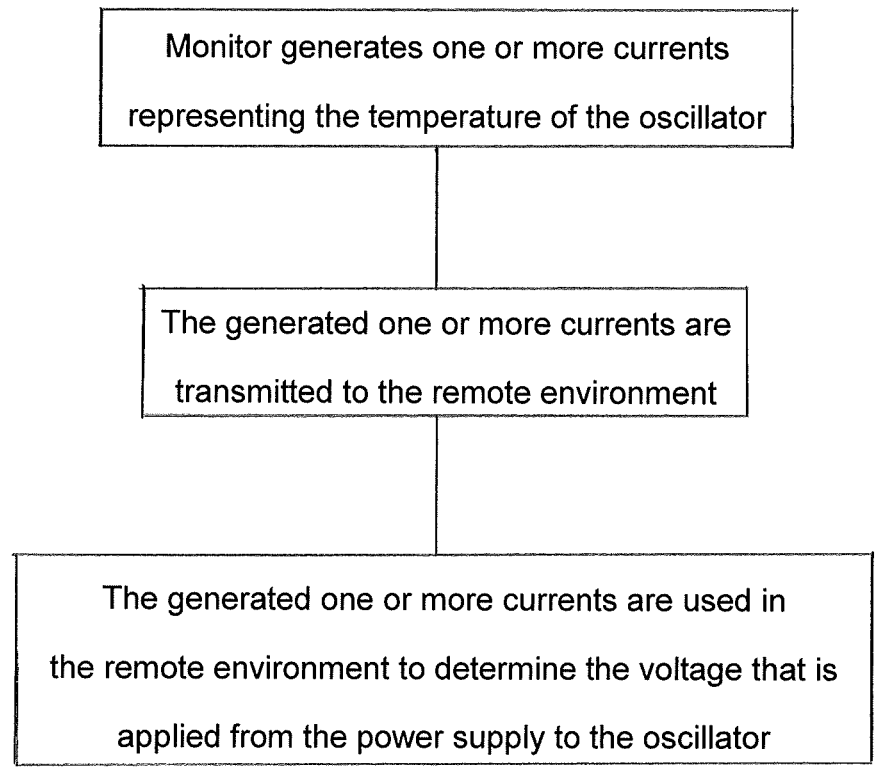
FIG. 2B illustrates using a generated current representing the temperature of the oscillator to determine the power supplied to the oscillator.

With reference to FIGS. 2 and 2A, in embodiments of the invention, monitoring is performed in a current mode. Current is supplied to the oscillator from a remote chamber, and current from the oscillator, proportional to the frequency or amplitude of the oscillator output signal, is sensed at the remote chamber.

The oscillator of FIG. 2 is intended to be used for lower phase noise, low jitter designs. The Q factor of the oscillator (resulting from the loaded Q factor of the constituent components coupled to the resonance tank) is inversely proportional to the absolute temperature of the oscillator environment, and a dynamic change in Q provides a measure of the temperature of the oscillator by observing a change in the oscillation amplitude. The system of FIG. 2 measures oscillator amplitude at the ambient temperature of the oscillator (device under test (DUT)), and derives a proportional current and feeds that proportional current to the remote environment RT. At direct current, the measured DC voltage is $V_{UR}$–IR. Hence, a difference amplifier at the first environment can accurately measure the current. The measured oscillator amplitude and the measured DC voltage together can be used for the temperature sensor.

Figure 3:
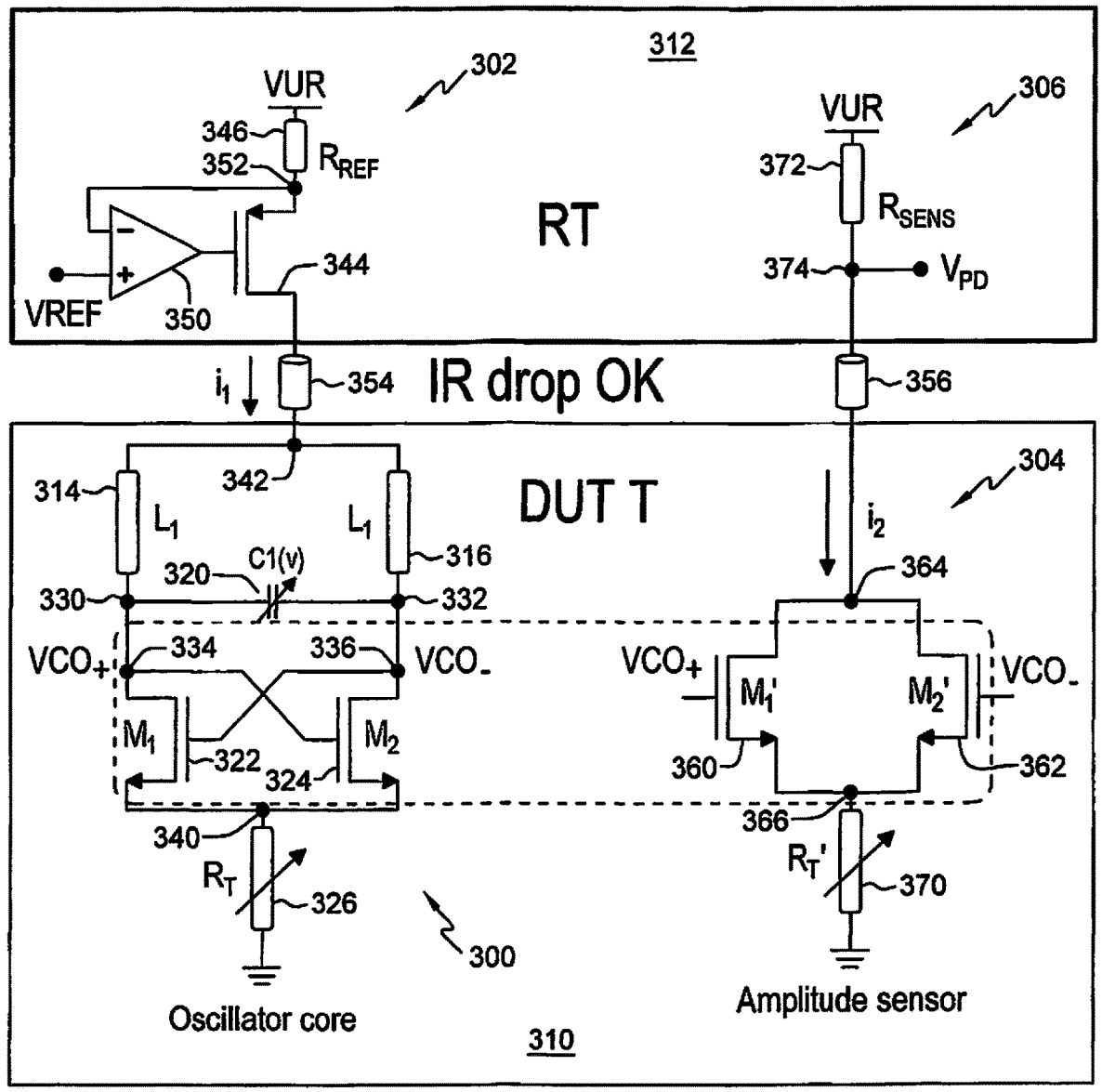
FIG. 3 shows a remotely powered low power oscillator with self-monitoring in accordance with an embodiment of the invention.

FIG. 3 shows, in more detail, a remotely powered low power oscillator 300 with self monitoring in accordance with an embodiment of the invention. More specifically, FIG. 3 shows low power oscillator 300, power supply 302 for the oscillator, amplitude sensor 304, and sensing resistor 306. In this embodiment, oscillator 300 is located in a first environment 310, amplitude sensor 304 is located in the same environment 310 as the oscillator, and power supply and sensor resistor 306 are located in a remote environment (RT) 312.

With the embodiment shown in FIG. 3, oscillator 300 comprises a pair of parallel inductors 314, 316, a variable capacitor 320, a pair of cross-coupled semiconductor devices 322, 324, and a variable resistor 326. Variable capacitor 320 is connected between nodes 330, 332, in series between inductors 314, 316. The drain of semiconductor device 322 is connected to node 334, and the drain of semiconductor device 324 is connected to node 336. The gate of device 322 is connected to node 336, and the gate of device 324 is connected to node 334. The sources of devices 322, 324 are connected to each other and to ground via node 340, and variable resistor 326 is located between node 340 and ground. The variable resistors 326 and 370 are digitally programmable and use the same type of resistor for easy tracking of process and temperature variations.

Power is supplied to oscillator 300 from power supply 302 via node 342. In the embodiment illustrated in FIG. 3, power is supplied from a voltage source $V_{UR}$ via a semiconductor device 344, and a reference resistor 346 may be located between voltage source $V_{UR}$ and pass transistor device 344 to limit the current through the semiconductor device. The output of an error amplifier 350 is applied to the gate of device 344 to control the current output from the semiconductor device. The voltage in power supply 302 at node 352 is applied to one input of the error amplifier 350, and a reference voltage $V_{REF}$ is applied to the other input of the error amplifier.

In the embodiment of FIG. 3, amplitude sensor 304 comprises a pair of connected semiconductor devices 360, 362. The drain terminals of semiconductor devices 360, 362 are connected to node 364, and the source terminals of devices 360, 362 are connected to node 366. The VCO+ voltage is applied to the gate of semiconductor device 360, and the VCO− voltage is applied to the gate of semiconductor device 362. Node 366 is connected to ground, and a variable resistor 370 is located between node 366 and ground. The variable resistors are digitally programmable and use the same type of resistors as resistor 326.

Current $I_2$ is provided by the amplitude sensor 304 from power source $V_{UR}$ via node 364, and $R_{SENS}$ 372 is located in series between $V_{UR}$ and the amplitude sensor. As discussed below, a peak detector voltage $V_{PD}$ may be measured at node 374, below $R_{SENS}$, providing information about the amplitude of oscillation.

In the embodiment shown in FIG. 3, the instrumentation wiring resistor 354 located between the first and second environments (e.g., the power supply 302 and the oscillator 300) reduces the DC voltage. However, as the controlling and observation mechanisms use current mode signaling, it greatly reduces the impact of the wiring resistance. Moreover, as the signaling occurs in DC, it also reduces the electromagnetic cross-talk. In embodiments of the invention, resistors 354 and 356 are part of the instrumentation. The system prefers the use of zero resistances, but that is not practical from a system perspective. Hence, in embodiments, the invention uses DC current to communicate between the two environments.

In the embodiment of FIG. 3, the VCO 300 and the amplitude sensor 304 use a similar topology, and $M_1'$, $M_2'$ and $R_T'$ are scaled replicas of $M_1$, $M_2$ and $R_T$ respectively. Semiconductors $M_1'$ and $M_2'$ of the amplitude sensor 304 can be physically collocated with the VCO transistors $M_1$ and $M_2$. A scaled version of a signal may also be coupled to a bulk terminal.

Amplitude senor 304 and oscillator 300 may be coupled by direct electrical coupling, scaled electrical coupling, or magnetic XFMR coupling.

$I_2$ contains quiescent and dynamic currents. Typically, it contains a much larger part of dynamic current than static current for accurate amplitude control.

Current may be sensed from the amplitude sensors drain or source nodes. Also, current may be sensed using PMOS transistors coupled to terminals.

Auxiliary transistor parameter measurements may be performed in the oscillator power down mode.

Figure 4:
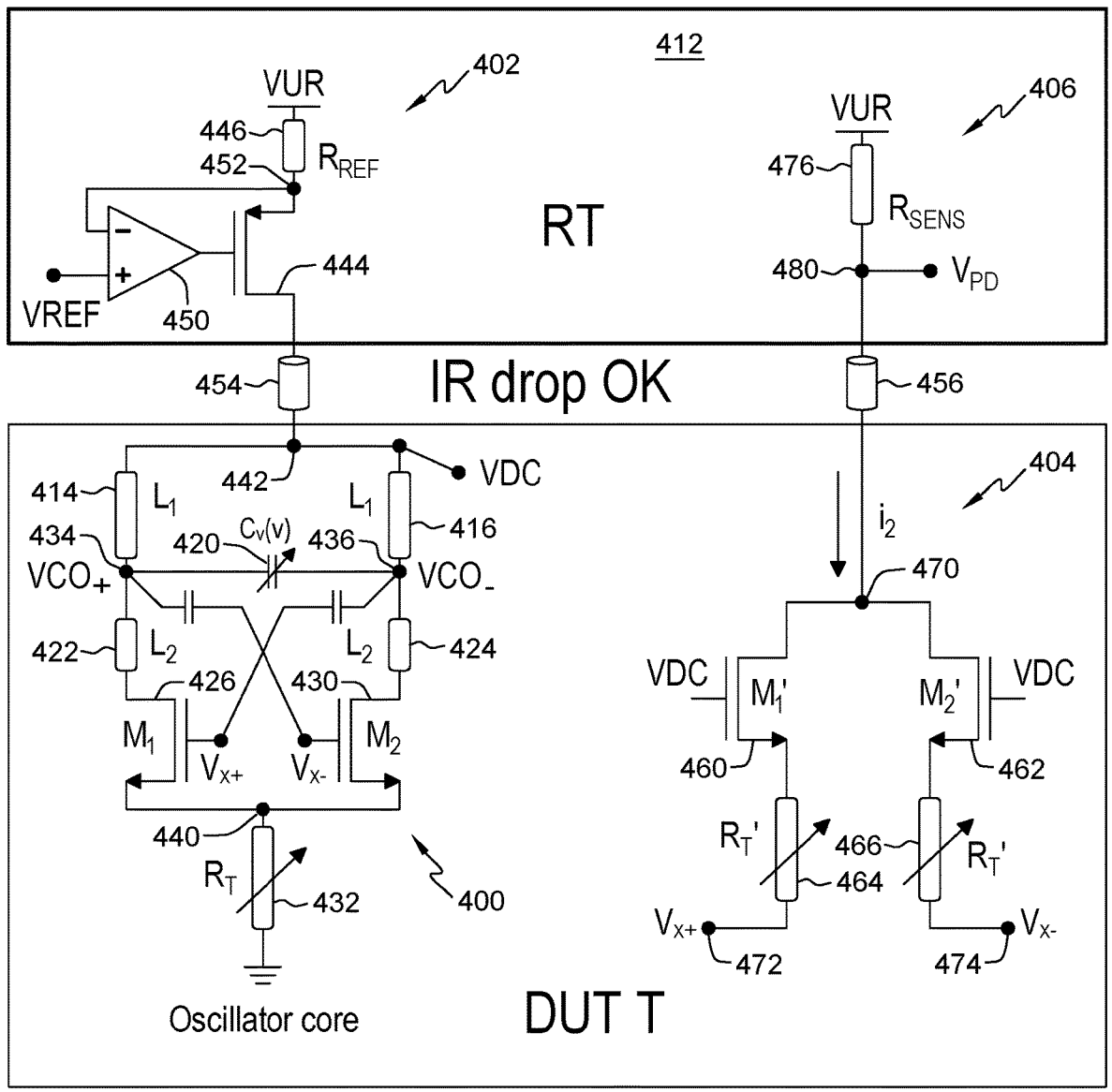
FIG. 4 shows a further low power oscillator in accordance with an embodiment of the invention.

FIG. 4 illustrates another embodiment of the invention. This embodiment includes low power oscillator 400, power supply 402 for the oscillator, amplitude sensor 404, and sensor 406. In this embodiment, oscillator 400 is located in a first environment 410, amplitude sensor 404 is located in the same environment 410 as the oscillator, and power supply 402 and sensor resistor 406 are located in a remote environment (RT) 412.

With the embodiment illustrated in FIG. 4, oscillator 400 comprises a first pair of single ended inductors 314, 316, a variable capacitor 420, a second pair of parallel inductors 422, 424, a pair of cross-coupled semiconductor devices 426, 430, and a variable resistor 432. Variable capacitor 420 is connected between nodes 434, 436, in series between inductors 414, 416. The drain of semiconductor device 426 is connected to inductor 422, and the drain of semiconductor device 430 is connected to inductor 424. The gate of device 426 is connected to node 436, and the gate of device 430 is connected to node 434. The sources of devices 426, 430 are connected to each other and to ground via node 440, and variable resistor 432 is located between node 440 and ground.

Power is supplied to oscillator 400 from power supply 402 via node 442. In the embodiment illustrated in FIG. 4, power is supplied from a voltage source $V_{UR}$ via a pass transistor 444, and a reference resistor 446 may be located between unregulated voltage source $V_{UR}$ and pass transistor 444 to provide the desired current through the semiconductor device. The output of an error amplifier 450 is applied to the gate of device 444 to control the current output from the semiconductor device. The voltage in power supply 402 at node 452 is applied to one input of the error amplifier 450, and a reference voltage VREF is applied to the other input of the error amplifier.

In the embodiment of FIG. 4, amplitude sensor 404 comprises a pair of connected semiconductor devices 460, 462 and a pair of variable resistors 464, 466. The drain terminals of semiconductor devices 460, 462 are connected to node 470, and the source terminals of devices 460, 462 are connected to nodes 472, 474 respectively. A fixed bias voltage VDC is applied to the gates of semiconductor device 460, 462. A $V_{X+}$ voltage at node 472 and a $V_{X-}$ voltage at node 474 represent the two opposite phases of the oscillation signal with the same amplitude and frequency.

Current $I_2$ is supplied to the amplitude sensor 494 from power source $V_{UR}$ via node 466, and $R_{SENS}$ 476 is provided in series between $V_{UR}$ and the amplitude sensor. As shown in FIG. 4, a peak detector voltage $V_{PD}$ can be measured at node 480, below $R_{SENS}$ 476.

In the embodiment shown in FIG. 4, a resistor 454 may be located between the power supply 402 and the oscillator 400 to drop, or reduce, the current from the power supply to the oscillator, and resistor 456 may be located between amplitude sensor 404 and the remote environment (RT) 412 to drop, or reduce, the current transmitted from to the amplitude sensor from the remote environment.

In the embodiment of FIG. 4, the VCO and the amplitude sensor use a similar topology, and $M_1'$, $M_2'$ and $R_T'$ are scaled replicas of $M_1$, $M_2$ and $R_T$ respectively. Semiconductors $M_1'$ and $M_2'$ of the amplitude sensor can be physically collocated with the VCO transistors M and $M_2$. A scaled version of a signal may also be coupled to a bulk terminal.

Figure 4A:
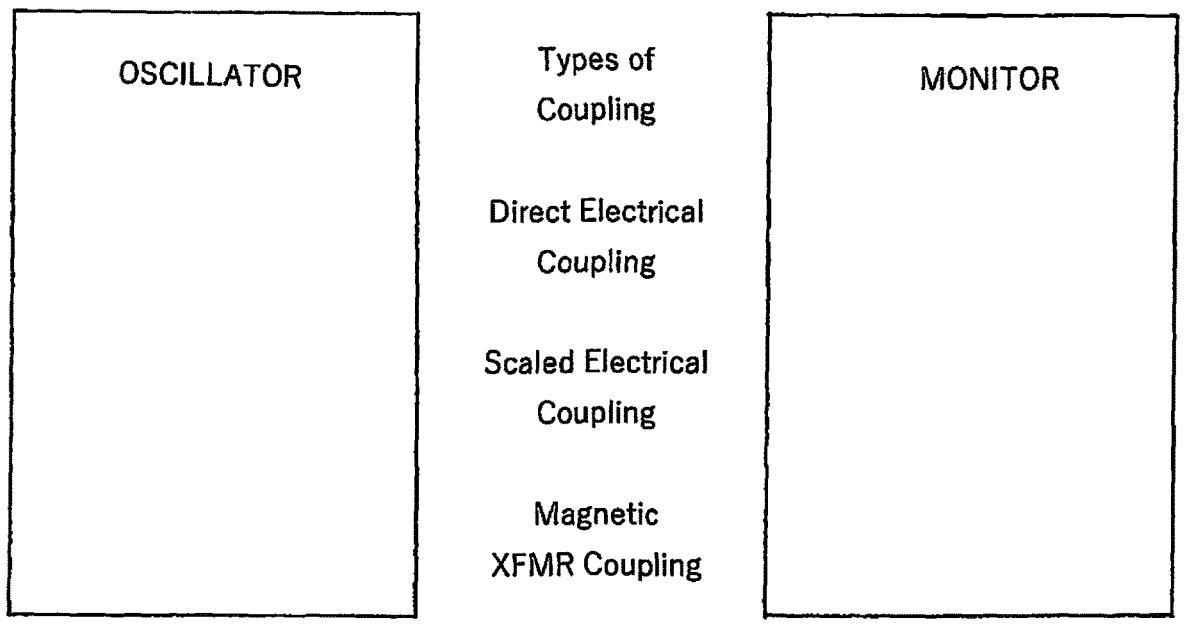
FIG. 4A shows different ways of coupling the low power oscillator and a monitor in embodiments of the invention.

With reference to FIG. 4A, amplitude sensor and oscillator may be coupled by direct electrical coupling, scaled electrical coupling, or magnetic XFMR coupling. Opposite phases may be coupled to bulk terminal to lower the threshold voltage $V_T$.

i2 contains only dynamic currents.

Current may be sensed from the amplitude sensors drain or source nodes. Also, current may be sensed using PMOS transistors coupled to terminals.

Auxiliary transistor parameter measurements may be performed in the oscillator power down mode.

FIG. 5 illustrates a procedure and usage of the system of FIG. 4 in accordance with an embodiment of the invention. At 502, a specific value of the current from power supply 402 is set by using $I_{REF}=V_{REF}/R_{REF}$. At 504, the oscillator amplitude is obtained. At 506, $R_T$ is set to an initial setting to obtain a desired voltage change in the output of the oscillator. At 510, the value of $V_{PD}$ is detected; and at 512, $R_T$ is adjusted until $V_{PD}$ is equal to a desired value.

A plurality of peak detectors, with shifted DC voltages, can be used in order to create a linear $V_{PD}$ vs. amplitude characteristics.

Figures 6, 7:
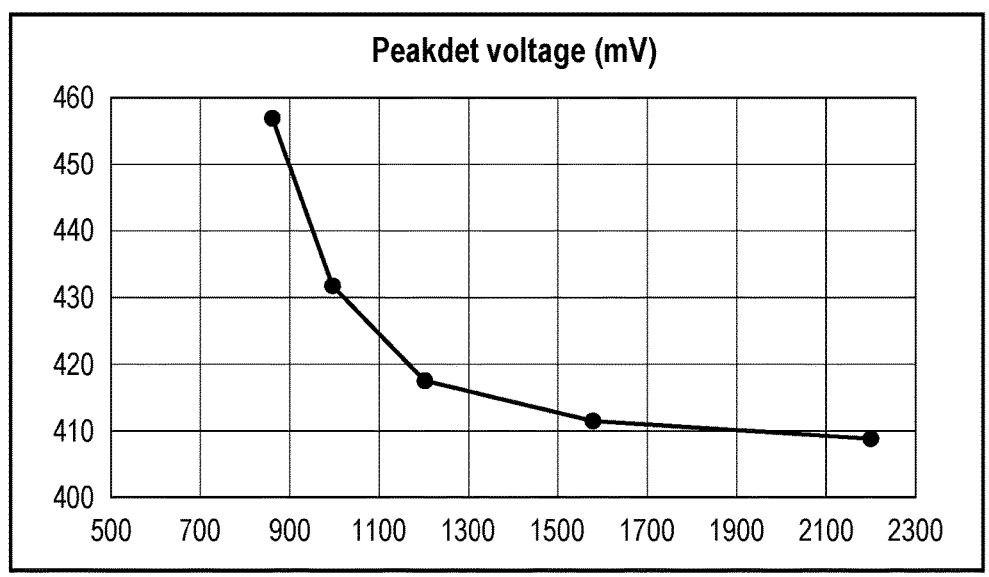
FIG. 6 shows a table with results of a simulation of an embodiment of the invention.
FIG. 7 is a graph showing the peak detected voltage from the table of FIG. 6 as a function of the amplitude in terms of its peak to peak differential values from the table.

FIGS. 6 and 7 show results of a simulation of an embodiment of the invention. The table of FIG. 6 shows, at each of five oscillator core average currents, the amplitude-ppd, the frequency of the oscillator, the phase noise of the oscillator at 1 MHz and at 10 MHz, and the peak detected voltage of the oscillator. The chart of FIG. 7 shows the peak detected voltage of the oscillator as a function of the peak to peak differential amplitude of the oscillator.

This intrinsic quadratic characteristics can be used, or the peak detector can be biased at Sub-$V_T$ for more linear characteristics.

FIG. 7 shows a unique mapping between oscillator amplitude and $V_{PD}$.

Figure 8:
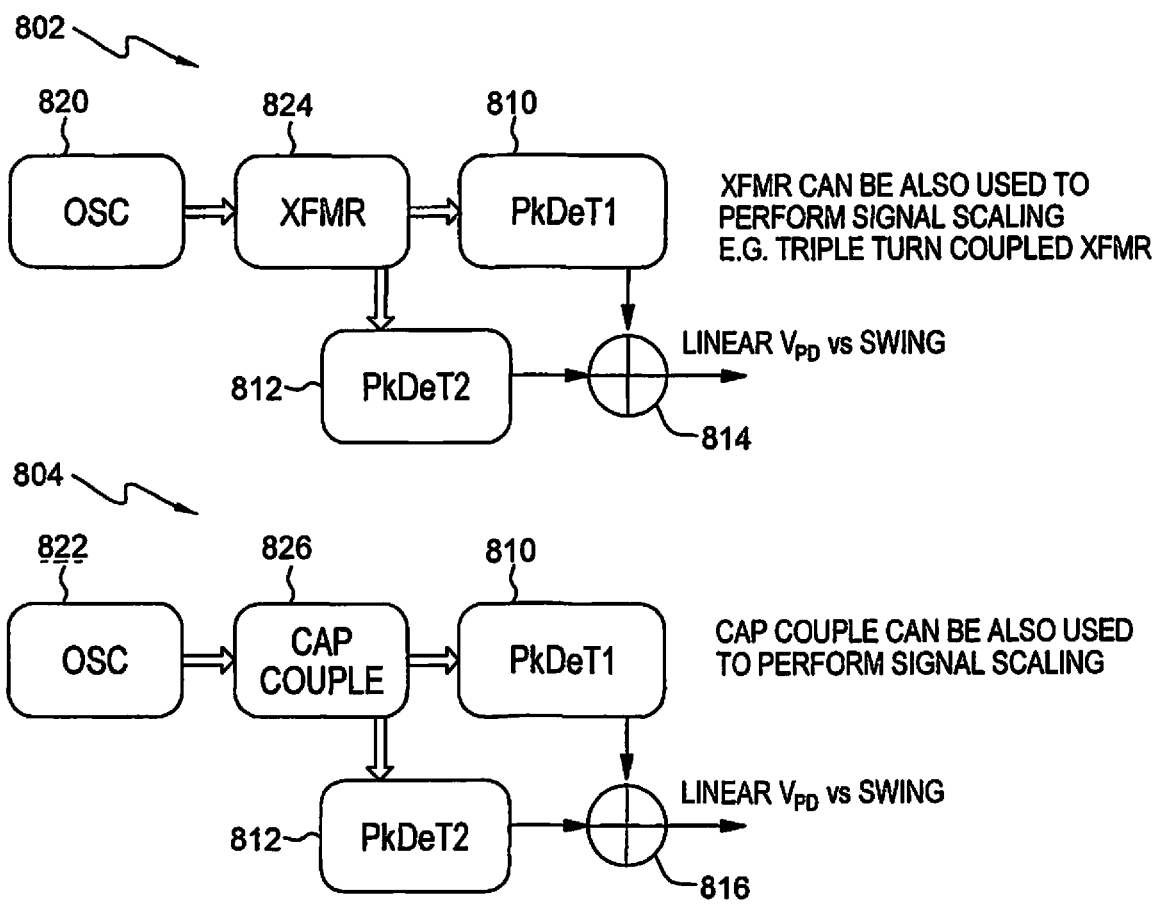
FIG. 8 illustrates additional embodiments of the invention in which a plurality of peak detectors are used to create peak detected voltage vs. amplitude characteristics.

FIG. 8 shows additional embodiments 802, 804 of the invention. In these embodiments, a plurality of peak detectors 810, 812 are used, as represented at 814, 816, to create a linear $V_{PD}$ vs. amplitude characteristics for oscillators 820, 822. In embodiment 802, a transformer 824 couples the oscillator 820 to the peak detectors 810, 812; and in embodiment 804, capacitive coupling 826 is used to couple the oscillator 822 to the peak detectors 810, 812.

In embodiments of the invention, the oscillator core and its power management system operate at different environments. This is a major challenge for all low temperature systems (e.g., quantum computing systems), and there is no solution in the present state-of-the-art that addresses this challenge. In embodiments of the invention, current mode interface between the two remote environments leads to low noise and parasitic insensitive supply and monitoring with DC current signaling between the two environments. In embodiments of the invention, a power and area intensive measurement related to phase noise is transposed to a measurement of amplitude at low temperature, a much simpler implementation/detection with respect to a look-up table for the same level of accuracy.

In embodiments of the invention, low phase noise is achieved by: (a) lower supply sensitivity due to current mode biasing (a precise current is provided from the remote environment RT); and (b) adequate realization of the voltage levels using substantially flicker noise free resistor coupled at the tail of the oscillator core. In embodiments of the invention, low power amplitude detector provides current mode output to the remote environment RT. Most of the high performance computing systems require stable clock frequency with high fidelity. Hence, in embodiments, the invention provides methods of realizing a low jitter oscillator as well as measuring the ambient temperature of the remote environment using the same hardware and minimum, low cost instrumentation overhead.

The description of the invention has been presented for purposes of illustration and description, and is not intended to be exhaustive or to limit the invention in the form disclosed. Many modifications and variations will be apparent to those of ordinary skill in the art without departing from the scope of the invention. The embodiments were chosen and described in order to explain the principles and applications of the invention, and to enable others of ordinary skill in the art to understand the invention. The invention may be implemented in various embodiments with various modifications as are suited to a particular contemplated use.

The invention claimed is:

1. A method comprising:
an oscillator core, in a first environment, generating an oscillating signal;
a power management system, in a second environment, supplying power to the oscillator core to operate the oscillator core, including supplying the power from a voltage source to the oscillator core via a pass transistor by applying a current output of the pass transistor to the oscillator core;
a sensing system, in the first environment, sensing one or more parameters of the oscillator core that are dependent on a temperature of the oscillator core, and generating one or more temperature dependent signals representing said temperature of the oscillator core;
transmitting the one or more temperature dependent signals representing the temperature of the oscillator core from the sensing system to the second environment; and
using in the second environment, the one or more temperature dependent signals representing the temperature of the oscillator core to generate a reference signal, and using the generated reference signal to determine the power supplied to the oscillator core from the power management system, including applying an output of an error amplifier to a gate of the pass transistor to control the current output of the pass transistor and the power supplied by the power management system to the oscillator core to operate the oscillator core, wherein the using the one or more temperature dependent signals to generate a reference signal includes:
applying the one or more temperature dependent signals to a peak voltage detector in the second environment to generate a peak voltage signal in the second environment representing the temperature of the oscillator core.

2. The method according to claim 1, wherein:
the transmitting the one or more signals from the sensing system to the second environment includes using DC communications between the first environment and the second environment to communicate the one or more signals to the second environment; and the supplying power to the oscillator core to operate the oscillator core includes using the DC communications between the first environment and the second environment to supply the power to the oscillator core.

3. The method according to claim 1, wherein the sensing system sensing one or more parameters of the oscillator core includes the sensing system sensing the one or more parameters of the oscillator core via a direct electrical coupling of the sensing system to the oscillator core.

4. The method according to claim 1, wherein the sensing system sensing one or more parameters of the oscillator core includes the sensing system sensing the one or more parameters of the oscillator core via a scaled electrical coupling of the sensing system to the oscillator core.

5. The method according to claim 1, wherein the sensing system sensing one or more parameters of the oscillator core includes the sensing system sensing the one or more parameters of the oscillator core via a magnetic coupling of the sensing system to the oscillator core.

6. The method according to claim 1, wherein the sensing system sensing one or more parameters of the oscillator core includes the sensing system sensing the one or more parameters of the oscillator core via a capacitive coupling of the sensing system to the oscillator core.

7. The method according to claim 1, wherein:
the oscillator core generates an oscillating signal having a frequency; and
the sensing system sensing one or more parameters of the oscillator core includes the sensing system sensing the frequency of the oscillating signal.

8. A method comprising:
an oscillator core, in a first environment, generating an oscillating signal;
a power management system, in a second environment, supplying power to the oscillator core to operate the oscillator core, including supplying the power from a voltage source to the oscillator core via a pass transistor by applying a current output of the pass transistor to the oscillator core;
a sensing system, in the first environment, sensing one or more parameters of the oscillator core that are dependent on a temperature of the oscillator core, and generating one or more temperature dependent signals representing said temperature of the oscillator core;
transmitting the one or more temperature dependent signals representing the temperature of the oscillator core from the sensing system to the second environment; and
using the one or more temperature dependent signals representing the temperature of the oscillator core in the second environment to generate a reference signal, and using the generated reference signal to determine the power supplied to the oscillator core from the power management system, including applying an output of an error amplifier to a gate of the pass transistor to control the current output of the pass transistor, wherein:
the oscillator core generates an oscillating signal having a variable amplitude; and
the sensing system sensing one or more parameters of the oscillator core includes the sensing system sensing the amplitude of the oscillating signal.

9. A system comprising:
an oscillator core, in a first environment, for generating an oscillating signal;

a power management system, in a second environment, for supplying power to the oscillator core to operate the oscillator core, including a pass transistor for supplying the power from a voltage source to the oscillator core by applying a current output of the pass transistor to the oscillator core, and an error amplifier for applying an output of the error amplifier to a gate of the pass transistor;
a sensing system, in the first environment, for sensing one or more parameters of the oscillator core that are dependent on a temperature of the oscillator core, for generating one or more temperature dependent signals representing said temperature of the oscillator core, and for transmitting the one or more temperature dependent signals representing the temperature of the oscillator core from the sensing system to the second environment; and
wherein the one or more temperature dependent signals representing the temperature of the oscillator core are used in the second environment to generate a reference signal, and the reference signal is used to determine the power supplied to the oscillator core from the power management system, including applying the output of the error amplifier to the gate of the pass transistor to control the current output of the pass transistor and the power supplied by the power management system to the oscillator core to operate the oscillator core, wherein the using the one or more temperature dependent signals to generate a reference signal includes:
applying the one or more temperature dependent signals to a peak voltage detector in the second environment to generate a peak voltage signal in the second environment representing the temperature of the oscillator core.

10. The system according to claim 9, wherein the sensing system is electrically coupled to the oscillator core to sense the one or more parameters of the oscillator core.

11. The system according to claim 9, wherein the sensing system is magnetically coupled to the oscillator core to sense the one or more parameters of the oscillator core.

12. The system according to claim 1, wherein:
the oscillator core generates an oscillating signal having a frequency; and
the one or more parameters includes changes in the frequency of the oscillating signal.

13. A system comprising:
a power source, in one environment, for supplying power to an oscillator core, in another environment to operate the oscillator core, including a pass transistor for supplying the power from a voltage source to the oscillator core by applying a current output of the pass transistor to the oscillator core, and an error amplifier for applying an output of the error amplifier to a gate of the pass transistor;
a monitor, in the another environment, for monitoring one or more parameters of the oscillator core that are dependent on a temperature of the oscillator core, for generating one or more temperature dependent signals representing said temperature of the oscillator core, and for transmitting the one or more temperature dependent signals representing the temperature of the oscillator core from the another environment to the one environment, and wherein the one or more temperature signals representing the temperature of the oscillator core are used in the one environment to generate a reference signal, and the reference signal is used to determine the power supplied to the oscillator core from the power source, including applying the output of the error amplifier to the gate of the pass transistor to control the current output of the pass transistor and the power supplied by the power source to the oscillator core to operate the oscillator core, wherein the using the one or more temperature dependent signals to generate a reference signal includes:

applying the one or more temperature dependent signals to a peak voltage detector in the second environment to generate a peak voltage signal in the second environment representing the temperature of the oscillator core.

14. The system according to claim 13, wherein the monitor is electrically coupled to the oscillator core to monitor the one or more parameters of the oscillator core.

15. The system according to claim 13, wherein the monitor is magnetically coupled to the oscillator core to sense the one or more parameters of the oscillator core.

16. The system according to claim 13, wherein:
the oscillator core generates an oscillating signal having a frequency; and
the monitor monitors changes in the frequency of the oscillating signal.

17. A method comprising:
an oscillator core, in a first environment, generating an oscillating signal;
a power management system, in a second environment, supplying power to the oscillator core to operate the oscillator core, including supplying the power from a voltage source to the oscillator core via a pass transistor by applying a current output of the pass transistor to the oscillator core;
a sensing system, in the first environment, sensing one or more parameters of the oscillator core that are dependent on a temperature of the oscillator core, and generating one or more temperature dependent signals representing said temperature of the oscillator core;
transmitting the one or more temperature dependent signals representing the temperature of the oscillator core from the sensing system to the second environment; and
using the one or more temperature dependent signals representing the temperature of the oscillator core in the second environment to generate a reference signal, and using the generated reference signal to determine the power supplied to the oscillator core from the power management system, including applying an output of an error amplifier to a gate of the pass transistor to control the current output of the pass transistor, wherein the using the one or more temperature dependent signals to generate a reference signal includes:
applying the one or more temperature dependent signals to a peak voltage detector in the second environment to generate a peak voltage signal in the second environment representing the temperature of the oscillator core; and
the using the generated reference signal to determine the power supplied to the oscillator core from the power management system further includes:
setting a specific value of the current from the power management system to the oscillator core;
obtaining an amplitude of the oscillator core;
setting the second environment to an initial setting to obtain a desired voltage change in an output of the oscillator core;
detecting a value of the peak voltage signal; and
adjusting the second environment until the value of the peak voltage signal is equal to a desired value.

18. A method comprising:
an oscillator core, in a first environment, generating an oscillating signal;
a power management system, in a second environment, supplying power to the oscillator core to operate the oscillator core, including supplying the power from a voltage source to the oscillator core via a pass transistor by applying a current output of the pass transistor to the oscillator core;
a sensing system, in the first environment, sensing one or more parameters of the oscillator core that are dependent on a temperature of the oscillator core, and generating one or more temperature dependent signals representing said temperature of the oscillator core;
transmitting the one or more temperature dependent signals representing the temperature of the oscillator core from the sensing system to the second environment; and
using the one or more temperature dependent signals representing the temperature of the oscillator core in the second environment to generate a reference signal, and using the generated reference signal to determine the power supplied to the oscillator core from the power management system, including applying an output of an error amplifier to a gate of the pass transistor to control the current output of the pass transistor, and
further comprising employing current mode signaling between the first and second environments to reduce DC voltage drop and electromagnetic cross-talk due to instrumentation wiring between the first and second environments.

* * * * *